United States Patent [19]

Reiffin

[11] Patent Number: 4,728,903

[45] Date of Patent: Mar. 1, 1988

[54] CLASS A HIGH-FIDELITY AMPLIFIER

[76] Inventor: Martin G. Reffin, 9262 Royal Palm Blvd., Garden Grove, Calif. 92641

[21] Appl. No.: 858,664

[22] Filed: May 2, 1986

[51] Int. Cl.[4] .............................................. H03F 3/30
[52] U.S. Cl. .................................... 330/264; 330/265; 330/266; 330/268; 330/300
[58] Field of Search ............... 330/151, 264, 265, 267, 330/268, 300, 266; 381/120, 121

[56] References Cited

U.S. PATENT DOCUMENTS 3,968,450  7/1976  Suzuki et al. ......................... 330/264
4,483,016  11/1984  Hochstein et al. ............. 330/264 X
4,531,099  7/1985  Nakane ................................ 330/267

OTHER PUBLICATIONS

Wen, "Simple Current Booster for Operational Amplifiers", *New Electronics*, vol. 14, No. 14, Jul. 1981, p. 27.
1984 *Databook*, vol. 29, Book 2, Mar. 1984, pp III, G30, 33, 34, 147.

*Primary Examiner*—James B. Mullins

[57] ABSTRACT

The disclosed amplifier comprises a MOSFET output stage biased for Class A operation and a bipolar current amplification stage biased for Class C operation. The latter stage is normally cut off, and at low power output levels the entire output signal current is provided by the output stage. Current sensing resistors measure the magnitude of the output current and apply to the base-emitter junctions of the current amplification transistors a bias voltage proportional to the output current. When this current reaches a predetermined magnitude the current amplification stage becomes active so as to provide additional output signal current in parallel with that provided by the output stage. As a result at higher power output levels the output stage sees a load impedance much higher than that of the loudspeaker system and therefore has a flatter load-line which maintains its operating point in the active region. The output stage is thereby maintained conductive and operates in the Class A mode notwithstanding a relatively moderate quiescent current of about one ampere.

15 Claims, 1 Drawing Figure

CLASS A HIGH-FIDELITY AMPLIFIER

FIELD OF THE INVENTION

This invention relates to transistor power amplifiers for high-fidelity music reproduction, and more particularly, to such amplifiers biased for Class A operation so that both halves of the push-pull output stage remain conductive throughout the cycle of operation.

DESCRIPTION OF THE PRIOR ART

In the present state of the art of high-fidelity music reproduction it is recognized that vacuum-tube amplifiers generally provide a sound quality superior to that of transistor amplifiers. Notwithstanding the higher initial cost, reduced reliablility, and higher running and maintenance expenses of tube amplifiers as compared with transistor amplifers, the former are the preferred components for many music listeners able and willing to pay large sums for superior sound reproduction.

However, there are a small number of transistor amplifiers which are regarded by many audiophiles as competitive with tube amplifiers. These exceptional transistor amplifiers are biased for Class A operation so that the output transistors remain conductive throughout the cycle of operation and are never cut off. As a result, these Class A transistor amplifiers avoid the usual crossover distortion generated at low power output levels by the nonlinear transfer characteristic in the crossover region where conventional Class AB transistor amplifiers have one output transistor turning off while the other output transistor turns on. Such crossover distortion is believed to be responsible for much of the inferior sound quality of the conventional Class AB transistor power amplifier, and its elimination by Class A operation is essential for the transistor power amplifier to be competitive with tube amplifiers.

Still another advantage of Class A operation is the reduction of temperature and current variations which would otherwise modulate the output transistor parameters and operating conditions so as to produce nonlinear distortion at higher power output levels.

Although the Class A transistor amplifier of the prior art is capable of excellent sound reproduction, it is an impractical solution for most consumers. Because of the inefficiency of Class A operation, prior art amplifiers operating in this mode are either limited to low power output or are extremely expensive to buy and operate.

In an effort to reduce the quiescent bias current and thereby reduce the cost of manufacture and operation, schemes of so-called "sliding-bias Class A" operation were devised in the prior art. These schemes attempted to vary the bias of the output stage dynamically with the signal so that both halves of the stage remained conductive notwithstanding a relatively low quiescent current. However it is questionable as to whether this approach provided any improvement justifying the added complication and expense, and the better transistor amplifiers now use "pure" Class A operation.

SUMMARY OF THE INVENTION

It is therefore a primary object of the present invention to provide novel transistor power amplifier circuitry wherein the output stage operates in the Class A mode without the expense and complication of prior Class A amplifiers.

This is achieved by continuously sensing the output signal current provided by the output stage. When this output current reaches a predetermined magnitude a current amplification stage is turned on to provide additional output current in parallel with the current provided by the output stage. This greatly increases the load impedance seen by the output stage so as to reduce the slope of its operating load-line. As a result the operating point of the output stage never reaches the cut-off region and both output stage transistors remain conductive throughout the operating cycle.

The current amplification stage is normally biased at cut-off during low signal levels, and the output stage then operates as a conventional Class A amplifier, with the current amplification stage inactive. Upon the output signal level reaching a predetermined magnitude to cause activation of the current amplification stage, the output stage takes on the additional function of driving the current amplification stage. During this phase of the cycle of operation the output stage retains control of the output signal by adding thereto those high-frequency components and transients which are too fast for the current amplification stage to amplify.

The fidelity of the output signal is thus determined by the Class A output stage, while most of the current at higher power output levels is provided by the current amplification stage.

In view of this division of labor the output stage preferably comprises MOSFET (metal oxide semiconductor field-effect transistor) devices whereas the current amplification stage preferably comprises bipolar transistors. The MOSFET devices have high thermal stability suitable for Class A operation and high-frequency response for feedback stability and precise signal resolution, whereas the bipolar transistors have large current output capability for providing most of the high signal level output current. The best attributes of each type of semiconductor device are thereby combined. This combination also obviates the respective disadvantages of each, such as the limited current capability and high output impedance of the MOSFET devices and the thermal instability and poorer frequency response of the bipolar transistors.

The combination of an output stage driving a current amplification stage was previously disclosed in FIG. 9 of each of my prior U.S. Pat. Nos. 3,376,388 and Re. 29,273 where the output stage is referred to as "quasi-output stage" and the current amplification stage as "output stage". However in these prior patents the "quasi-output stage" did not operate in Class A, was not complementary, did not combine the respective advantages of MOSFET and bipolar devices, did not reverse-bias the current amplification transistors when turning the latter off, was not driven by symmetrical preceding stages, and did not provide a symmetrical inner feedback loop. The significance and advantages of these novel aspects of the present invention will be described below.

DETAILED DESCRIPTION

Circuit Topology

Figure 1:
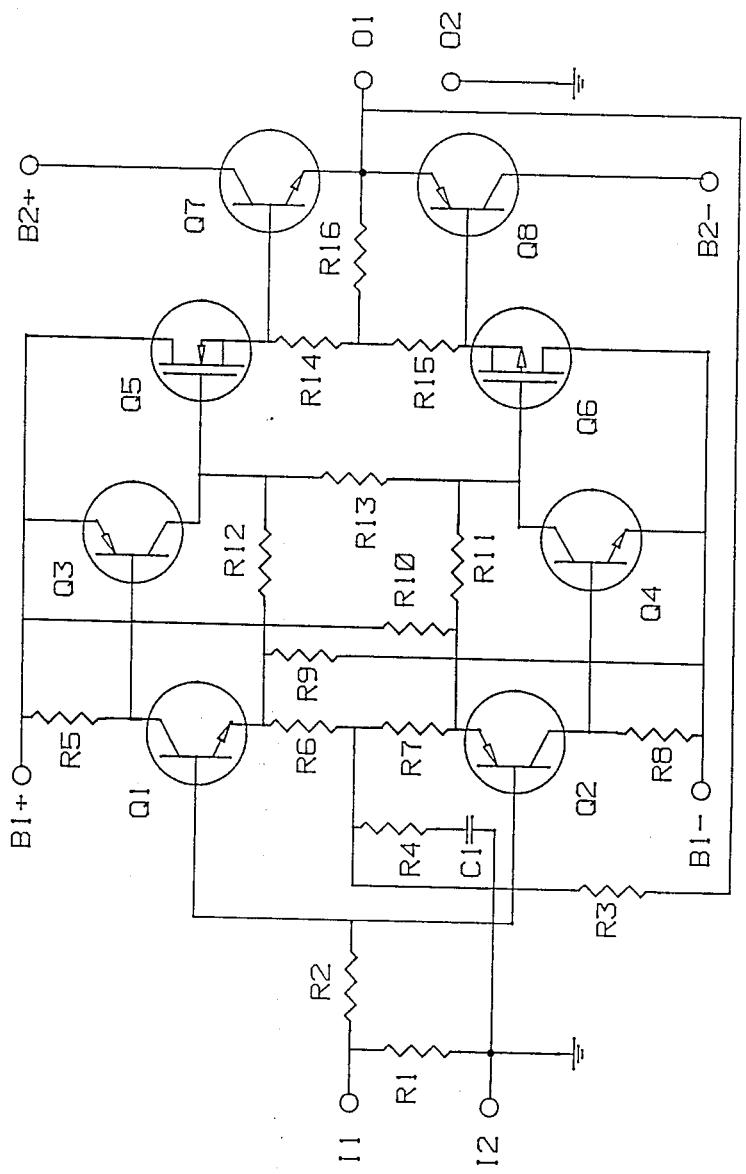
FIG. 1 is a schematic circuit diagram showing a preferred embodiment of the amplifier in accordance with the present invention.

Referring now to the drawing in more detail, there is shown an amplifier circuit in accordance with the present invention and comprising an input stage Q1,Q2, a drive stage Q3,Q4, an output stage Q5,Q6 and a current amplification stage Q7,Q8. The output stage transistors Q5,Q6 are preferably MOSFET (metal oxide semiconductor field-effect transistor) devices, whereas the current amplification stage transistors Q7,Q8 are preferably bipolar devices. The input stage transistors Q1,Q2 and drive stage transistors Q3,Q4 are shown as bipolar devices but may instead be field-effect devices.

A hot input terminal I1 is connected through resistor R2 to the respective bases of input stage transistors Q1,Q2. The other input terminal I2 is grounded. A resistor R1 extends between input terminal I1 and the ground at terminal I2. An input signal may be applied to terminals I1,I2 by connecting the latter to the output of a preamplifier (not shown) or other suitable source.

Input stage transistors Q1,Q2 are complementary, with transistor Q1 shown as NPN polarity and transistor Q2 as PNP. The collector of transistor Q1 is connected through load resistor R5 to the positive terminal B1+ of a first power supply and the collector of transistor Q2 is similarly connected through load resistor R8 to the negative terminal B1− of said first power supply.

The emitters of input transistors Q1,Q2 are connected to the respective ends of resistors R6,R7 having their other ends connected to form a feedback signal injection node for the outer feedback network comprising resistors R3,R4 and capacitor C1. Feedback resistor R3 extends from a hot output terminal O1 to the junction of resistors R4,R6,R7 and capacitor C1 is in series with resistor R4 and the ground. A current source resistor R9 extends from the emitter of input transistor Q1 to the negative power supply terminal B1− and another current source resistor R10 similarly extends from the emitter of input transistor Q2 to the positive power supply terminal B1+.

Drive stage transistors Q3,Q4 are complementary with transistor Q3 shown as type PNP and transistor Q4 as type NPN. The base of drive transistor Q3 is direct-coupled to the collector of input transistor Q1 and the base of drive transistor Q4 is direct-coupled to the base of input transistor Q2. The emitter of drive transistor Q3 is connected to the positive power supply terminal B1+ and the emitter of drive transistor Q4 is connected to the negative power supply terminal B1−.

A load resistor R13 extends between the collectors of drive transistors Q3,Q4. Also connected to these collectors are the respective ends of feedback resistors R11,R12 having their other ends connected to the emitters of input transistors Q1,Q2 so as to form an inner feedback network.

Output stage MOSFET transistors Q5,Q6 are complementary and have their gates direct-coupled to the collectors of drive transistors Q3,Q4 respectively. The drain of output transistor Q5 is connected to the positive power supply terminal B1+ the drain of output transistor Q6 is connected to the negative power supply terminal B1−.

The source of output transistor Q5 is connected to one end of a resistor R14 and the source of output transistor Q6 is connected to one end of a resistor R15. The other ends of resistors R14,R15 are connected to one end of a resistor R16 having its other end direct-coupled to the hot output terminal O1. The other output terminal O2 is grounded.

Current amplification stage Q7,Q8 comprises a complementary pair of bipolar transistors having their emitters direct-coupled to the hot output terminal O1. The bases of transistors Q7,Q8 are direct-coupled to the respective sources of output transistors Q5,Q6, and the collectors of transistors Q7,Q8 are connected to the respective terminals B2+,B2− of a second power supply.

Operation

The output signal of a preamplifier (not shown) or other high-level source is applied as an input signal to the input terminals I1,I2 of the disclosed amplifier. This input signal is transmitted through resistor R2 to the respective bases of input transistors Q1,Q2. The latter operate in the Class A common-emitter mode so that an amplified signal appears at their collectors. The latter are direct-coupled to the respective bases of drive transistors Q3,Q4 which also operate in the Class A common-emitter mode so that the signal is further amplified at the collectors of drive transistors Q3,Q4. The latter collectors are direct-coupled to the respective gates of MOSFET output transistors Q5,Q6.

MOSFET output transistors Q5,Q6 are preferably biased for Class A operation with a quiescent current of about one ampere. The output signal current flows to the load from Q5,Q6 through current sensing resistors R14,R15,R16.

The current amplification transistors Q7,Q8 are biased for Class C operation and remain substantially cut off until the output current through resistors R14,R15,R16 becomes large enough to increase the base-emitter voltage of either Q7 or Q8 to the turn-on point.

This occurs before MOSFET output transistor Q5 or Q6 cuts off. Therefore transistors Q5,Q6 always remain conductive so as to operate in Class A mode. After current amplification transistor Q7 or Q8 turns on it provides most of the power output, with the MOSFET output transistors Q5,Q6 still controlling the output signal by providing the output signal components for the crossover region and also those fast transients and high-frequency signal details which the slower current amplification transistors Q7,Q8 may be unable to amplify.

Describing the coaction of the output and current amplification stages in more detail, assume first that the signal at the collectors of drive transistors Q3,Q4 is positive with respect to ground. Since output MOSFET transistors Q5,Q6 operate in the source-follower mode the potential of the source terminal of output transistor Q5 will also be positive with respect to ground. Output signal current will then flow from the source of output transistor Q5 through resistor R14 (downwardly as viewed in the drawing) and then through resistor R16 to the hot output terminal O1.

The signal current flowing through resistors R14,R16 produces a voltage drop across the latter and thereby applies a forward bias to the base-emitter junction of the upper current amplification transistor Q7. The magnitude of this forward bias is directly proportional to the magnitude of the output signal current flowing through resistors R14,R16 to output terminal O1. When the output signal current reaches a predetermined magnitude this forward bias becomes large enough to turn on the upper current amplification transistor Q7. Current then flows through the latter from power supply terminal B2+ to hot output terminal O1.

As the forward bias across resistors R14,R16 and hence across the base-emitter junction of transistor Q7 increases this transistor conducts more heavily until it provides most of the output current flowing to hot output terminal O1 and to the loudspeaker system connected to the latter. The upper MOSFET output transistor Q5 then has the additional function of acting as a driver for the current amplification transistor Q7.

After the signal reaches its peak positive amplitude it then swings downwardly toward the ground level. The output signal current flowing through resistors R14,R16 to output terminal O1, and hence also the forward bias voltage across the base-emitter junction of current amplification transistor Q7, continue to decrease until transistor Q7 is cut off. Output transistor Q5 then resumes its original sole function of providing the output signal unaided by current amplification transistor Q7.

As the output signal continues to swing downwardly in the negative direction the output current flows through resistor R16 in the opposite direction, that is, from output terminal O1 (from right to left as viewed in the drawing). This output current then flows downwardly through resistor R15 through the lower MOSFET output transistor Q6. The resulting voltage drop across resistors R15,R16 provides a forward bias across the base-emitter junction of lower current amplification transistor Q8. When this forward bias reaches a predetermined magnitude transistor Q8 turns on so that transistors Q6,Q8 coact during the negative signal swing in the manner described above for transistors Q5,Q7 during the positive signal swing.

During the intervals when current amplification transistor Q7 or Q8 is conducting, MOSFET output transistors Q5,Q6 still directly control and determine the frequency and distortion characteristics of the output signal at output terminals O1,O2. This is because MOSFET output transistors Q5,Q6 operate in the source-follower mode with their source terminals directly coupled to output terminal O1. As a result, any tendency of the signal at output terminal O1 to deviate from the signal at the gates of output transistors Q5,Q6 causes the latter to supply directly to output terminal O1 a current which supplements the current provided by current amplification transistor Q7 or Q8 so as to minimize the deviation that would otherwise occur if current amplification transistor Q7 or Q8 were the sole provider of the output signal current.

For example, if the signal contains a steep transient or fast details requiring for accurate reproduction the amplification of high-frequency components beyond the capability of current amplification transistors Q7,Q8 these components are provided by MOSFET output transistors Q5,Q6 while the lower-frequency components of the signal are simultaneously provided by current amplification transistor Q7 or Q8.

The combination of MOSFET output transistors Q5,Q6 and bipolar current amplification transistors Q7,Q8 provides the advantages of each type of device while obviating the respective disadvantages. The MOSFET devices have superior frequency response which is imparted to the combination by virtue of the control which output transistors Q5,Q6 retain over the quality of the output signal.

The MOSFET devices also have superior thermal stability which obviates thermal runaway during Class A operation without requiring expensive heatsinks. This attribute is further aided by the fact that the output transistors Q5,Q6 may be biased at the relatively low quiescent current of about one ampere because the major portion of the current at high output levels is provided by the current amplification transistors Q7,Q8 which turn on to increase the impedance of the load seen by output transistors Q5,Q6. The latter are thereby maintained conductive notwithstanding their relatively low quiescent current.

MOSFET output devices as conventionally implemented suffer from the disadvantage of limited current capability as compared with bipolar output devices. This problem is obviated in the present combination because most of the signal current at high power output levels is provided by bipolar current amplification transistors Q7,Q8.

MOSFET output devices as conventionally implemented also have the disadvantage of relatively high output impedance resulting in poor damping factors. Since the damping factor is significant only at low frequencies and therefore at higher power output levels when current amplification transistors Q7,Q8 are conductive to provide a relatively low output impedance as seen by the speaker system, this disadvantage of MOSFET devices is obviated by the present combination.

Bipolar devices as conventionally implemented for output stages have the disadvantage of thermal instability and consequent runaway, normally requiring either a low quiescent current or expensive heat sinks and power supplies. The former alternative produces distortion of the signal whereas the latter is prohibitively expensive for most consumers. In the present combination the quiescent current required for Class A operation is substantially reduced, and further, is provided entirely by the MOSFET output transistors Q5,Q6 which have no tendency to thermal runaway even with inexpensive heat sinking.

Another disadvantage of bipolar devices as conventionally implemented for output stages is their relatively poor high-frequency response as compared with MOSFET devices. This disadvantages is also obviated in the present combination where those fast signal components which the bipolar transistors Q7,Q8 fail to amplify are automatically amplified instead by the MOSFET transistors Q5,Q6.

The inner feedback network comprising resistors R6,R7,R11,R12 serves three primary functions: (1) it raises the frequency of the dominant high-frequency pole of the inner feedback loop comprising the first two stages Q1, Q2 and Q3, Q4, and thereby increases the stability margin of the overall outer feedback loop; (2) it lowers the output impedance of the drive stage Q3,Q4 so that the latter may drive the high input capacitance of the output MOSFET transistors Q5,Q6; and (3) it reduces the nonlinear distortion of the first two stages within the inner feedback loop.

The outer feedback signal is transmitted by feedback resistor R3 and is summed with the inner feedback signal at the node joining resistors R6,R7.

The arrangement of resistors R14,R15,R16 permit the selection of design values to provide the desired quiescent current in the output stage Q5,Q6 and also the desired load current at which the current amplification transistor Q7 or Q8 is turned on. Resistor R16 further serves to reverse-bias the base-emitter junction of transistor Q7 or Q8 while the latter is being turned off so as to drain the base of the excess majority carriers and thereby accelerate the turnoff time of transistors Q7,Q8.

Modifications

The specific embodiment shown in the drawing is merely illustrative of one of the many forms which the invention may take in practice and numerous modifications thereof will readily occur to those skilled int he art, such as, for example, the following:

A complementary push-pull emitter-follower stage may be inserted between drive stage Q3,Q4 and output stage Q5,Q6. The inner feedback network R11,R12 may then be eliminated, if desired. The bases of this additional emitter-follower stage would be respectively direct-coupled to the collectors of drive transistors Q3,Q4 and the emitters of this additional stage would be respectively direct-coupled through conventional gate resistors to the gate terminals of MOSFET output transistors Q5,Q6.

Active current sources may be substituted for load resistors R5,R8 and/or source resistors R9,R10.

A cascode pair of transistors may be substituted for each of the input stage transistors Q1,Q2.

Other modifications will be obvious to those skilled in the art without departing from the scope of the invention as delineated by the appended claims which are to be interpreted as broadly as permitted by the prior art.

I claim:

1. A transistor power amplifier operating in Class A mode for driving a high-fidelity loudspeaker for the reproduction of music without audible distortion, said amplifier comprising
    a complementary-symmetry push-pull output stage comprising a complementary pair of field-effect power output transistors,
    a complementary-symmetry push-pull current amplification stage comprising a complementary pair of bipolar power output transistors,
    said field-effect transistors having a more extended frequency response and greater thermal stability than said bipolar transistors,
    said bipolar transistors having a higher current capability and lower output impedance than said field-effect transistors,
    said field-effect transistors each having a source electrode,
    said bipolar transistors each having a base electrode and an emitter electrode,
    an output terminal for connection to a high-fidelity loudspeaker system,
    current-sensing resistor means extending from said source electrodes to said output terminal,
    said resistor means having an impedance of a magnitude to permit sufficient output current to flow from said source electrodes through said resistor means to said output terminal and then through said loudspeaker system to drive the latter,
    first conductive means connecting said current amplification stage bipolar transistor base electrodes to said current-sensing resistor means,
    second conductive means connecting said current amplification stage bipolar transistor emitter electrodes to said output terminal,
    means biasing said output stage field-effect transistors to an active state with a predetermined quiescent current sufficient in magnitude for normal operation in the Class A mode, and
    means biasing said current amplification stage bipolar transistors to a quiescent state approximately at cutoff,
    whereby at lower amplifier power output levels said loudspeaker system is driven solely by said field-effect output stage until the magnitude of the output current flowing through said current-sensing resistor means reaches a predetermined value to apply a signal voltage to said base electrodes, thereby activating the current amplification stage to provide additional current to said output terminal while the field-effect output stage still maintains control over the frequency and distortion characteristics of the output signal driving the loudspeaker system, and
    whereby there are provided the combined advantages of the extended frequency response and thermal stability of the field-effect transistors and the high current capability and low output impedance of the bipolar transistors.

2. A transistor power amplifier as recited in claim 1 wherein
    said current sensing resistor means comprises a pair of resistors each having one end connected to a respective one of said source electrodes and the opposite end connected to a common node, and
    a third resistor having one end connected to said common node and the other end connected to said output terminal,
    said first conductive means connecting each of said current amplification stage bipolar transistor base electrodes to a respective one of said source electrodes.

3. A transistor power amplifier as recited in claim 1 and comprising
    a power supply having a positive terminal and a negative terminal,
    a complementary push-pull input stage comprising a complementary pair of transistors each having a base electrode, a collector electrode, and an emitter electrode,
    a pair of current-source means each connected between a respective one of said emitter electrodes and a respective one of said power supply terminals,
    an input terminal connected to said base electrodes of said input stage transistors,
    a pair of load impedance means each connected between a respective one of said power supply terminals and a respective one of said input stage transistor collectors,
    a complementary push-pull drive stage comprising a complementary pair of transistors each having a base electrode, a collector electrode and an emitter electrode,
    means connecting each of said drive stage transistor emitter electrodes to a respective one of said power supply terminals,
    means direct-current-coupling each of said input stage transistor collector electrodes to a respective one of said drive stage transistor base electrodes,
    each of said field-effect power output transistors having a gate electrode, and
    means direct-current-coupling each of said drive stage transistor collector electrodes to a respective one of said gate electrodes of said field-effect power output transistors.

4. A transistor power amplifier as recited in claim 3 and comprising
    an inner feedback network extending around said input and drive stages, and
    an outer feedback network extending from said output terminal to the emitters of said input stage.

5. A transistor power amplifier as recited in claim 3 wherein said current sensing resistor means comprises a pair of resistors each having one end connected to a respective one of said source electrodes and the opposite end connected to a common node, and a third resistor having one end connected to said common node and the other end connected to said output terminal, said first conductive means connecting each of said current amplification stage bipolar transistor base electrodes to a respective one of said source electrodes.

6. A transistor power amplifier for driving a high-fidelity loudspeaker for the reproduction of music without audible distortion, said amplifier comprising a complementary-symmetry push-pull output stage comprising a complementary pair of field-effect power output transistors, a complementary-symmetry push-pull current amplification stage comprising a complementary pair of bipolar power output transistors, said field-effect transistors having greater thermal stability than said bipolar transistors, said bipolar transistors having a higher current capability than said field-effect transistors, said field-effect transistors each having a source electrode, said bipolar transistors each having a base electrode and an emitter electrode, an output terminal for connection to a high-fidelity loudspeaker system, current-sensing resistor means extending from said source electrodes to said output terminal, said resistor means having an impedance of a magnitude to permit sufficient output current to flow from said source electrodes through said resistor means to said output terminal and then through said loudspeaker system to drive the latter, first conductive means connecting said current amplification stage bipolar transistor base electrodes to said current-sensing resistor means, second conductive means connecting said current amplification stage bipolar transistor emitter electrodes to said output terminal, means biasing said output stage field-effect transistors to an active state with a predetermined quiescent current, and means biasing said current amplification stage bipolar transistors to a quiescent state approximately at cutoff, whereby at lower amplifier power output levels said loudspeaker system is driven solely by said field-effect output stage until the output current flowing through said current-sensing resistor means reaches a predetermined value to apply a signal voltage to said base electrodes, thereby activating the current amplification stage to provide additional current to said output terminal, whereby there are provided the combined advantages of the thermal stability of the field-effect transistors and the high current capability of the bipolar transistors.

7. A transistor power amplifier as recited in claim 6 wherein said current sensing resistor means comprises a pair of resistors each having one end connected to a respective one of said source electrodes and the opposite end connected to a common node, and a third resistor having one end connected to said common node and the other end connected to said output terminal, said first conductive means connecting each of said current amplification stage bipolar transistor base electrodes to a respective one of said source electrodes.

8. A transistor power amplifier as recited in claim 6 and comprising a power supply having a positive terminal and a negative terminal, a complementary push-pull input stage comprising a complementary pair of transistors each having an input electrode, an output electrode, and a common electrode, a pair of current-source means each connected between a respective one of said common electrode and a respective one of said power supply terminals, an input terminal connected to said input electrodes of said input stage transistors, a complementary push-pull drive stage comprising a complementary pair of transistors each having an input electrode, an output electrode and a common electrode, means direct-current-coupling each of said input stage transistor output electrodes to a respective one of said drive stage transistor input electrodes, each of said field-effect power output transistors having a gate electrode, and means direct-current-coupling each of said drive stage transistor output electrodes to a respective one of said gate electrodes of said field-effect power output transistors.

9. A transistor power amplifier as recited in claim 8 wherein said current sensing resistor means comprises a pair of resistors each having one end connected to a respective one of said source electrodes and the opposite end connected to a common node, and a third resistor having one end connected to said common node and the other end connected to said output terminal, said first conductive means connecting each of said current amplification stage bipolar transistor base electrodes to a respective one of said source electrodes.

10. A transistor power amplifier for driving a high-fidelity loudspeaker for the reproduction of music without audible distortion, said amplifier comprising a complementary-symmetry push-pull output stage comprising a complementary pair of power output transistors, a complementary-symmetry push-pull current amplification stage comprising a complementary pair of power output transistors, said output stage transistors having greater thermal stability than said current amplification transistors, said current amplification transistors having a higher current capability than said output stage transistors, said output stage transistors each having an output electrode, said current amplification transistors each having an input electrode and an output electrode, an output terminal for connection to a high-fidelity loudspeaker system, current-sensing impedance means extending from said output stage transistor output electrodes to said output terminal, said impedance means having an impedance of a magnitude to permit sufficient output current to flow from said output stage transistor output electrodes through said impedance means to said output terminal and then through said loudspeaker system to drive the latter, first conductive means connecting said current amplification transistor input electrodes to one end of said current-sensing impedance means, second conductive means connecting said current amplification transistor output electrodes to the other end of said impedance means, means biasing said output stage transistors to an active state with a predetermined quiescent current, whereby at lower amplifier power output levels said loudspeaker system is driven by said output stage until the magnitude of the output current flowing through said current-sensing impedance means reaches a predetermined value to apply a signal voltage to said input electrodes of the current amplification transistors, thereby activating the current amplification stage to provide additional current to said output terminal, and whereby there are provided the combined advantages of the thermal stability of the output stage transistors and the high current capability of the current amplification transistors.

11. A transistor power amplifier as recited in claim 10 wherein said current sensing impedance means comprises a pair of resistors each having one end connected to a respective one of said output stage transistor output electrodes and the opposite end connected to a common node, and a third resistor having one end connected to said common node and the other end connected to said output terminal, said first conductive means connecting each of said current amplification stage transistor input electrodes to a respective one of said output stage transistor output electrodes.

12. A transistor power amplifier as recited in claim 10 and comprising a power supply having a positive terminal and a negative terminal, a complementary push-pull input stage comprising a complementary pair of transistors each having an input electrode, an output electrode, and a common electrode, a pair of current-source means each connected between a respective one of said common electrodes and a respective one of said power supply terminals, an input terminal connected to said input electrodes of said input stage transistors, a complementary push-pull drive stage comprising a complementary pair of transistors each having an input electrode and an output electrode, means direct-current-coupling each of said input stage transistor output electrodes to a respective one of said drive stage transistor input electrodes, each of said output stage transistors having an input electrode, and means direct-current-coupling each of said drive stage transistor output electrodes to a respective one of said input electrodes of said output stage transistors.

13. A transistor power amplifier as recited in claim 12 wherein said current sensing impedance means comprises a pair of resistors each having one end connected to a respective one of said output stage transistor output electrodes and the opposite end connected to a common node, and a third resistor having one end connected to said common node and the other end connected to said output terminal, said first conductive means connecting each of said current amplification stage transistor input electrodes to a respective one of said output stage transistor output electrodes.

14. A transistor power amplifier as recited in claim 13 and comprising an inner feedback network extending around said input and drive stage, and an outer feedback network extending from said output terminal to said input stage.

15. A transistor power amplifier as recited in claim 10 and comprising a power supply having a positive terminal and a negative terminal, a complementary push-pull input stage comprising a complementary pair of transistors each having a base electrode, a collector electrode, and an emitter electrode, a pair of current-source means each connected between a respective one of said emitter electrodes and a respective one of said power supply terminals, an input terminal connected to said base electrodes of said input stage transistors, a pair of load impedance means each connected between a respective one of said power supply terminals and a respective one of said input stage transistor collectors, a complementary push-pull drive stage comprising a complementary pair of transistors each having a base electrode, a collector electrode and an emitter electrode, means connecting each of said drive stage transistor emitter electrodes to a respective one of said power supply terminals, means direct-current-coupling each of said input stage transistor collector electrodes to a respective one of said drive stage transistor base electrodes, each of said output stage transistors having an input electrode, and means direct-current-coupling each of said drive stage transistor collector electrodes to a respective one of said input electrodes of said output stage transistors.

* * * * *